(12) United States Patent
Huh et al.

(10) Patent No.: US 10,944,082 B2
(45) Date of Patent: Mar. 9, 2021

(54) VAPOR DEPOSITION APPARATUS

(71) Applicant: SAMSUNG DISPLAY CO., LTD., Yongin-si (KR)

(72) Inventors: Myung-Soo Huh, Yongin-si (KR);
Suk-Won Jung, Yongin-si (KR);
Jin-Kwang Kim, Yongin-si (KR);
In-Kyo Kim, Yongin-si (KR);
Choel-Min Jang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 193 days.

(21) Appl. No.: 16/045,909

(22) Filed: Jul. 26, 2018

(65) Prior Publication Data

US 2018/0342708 A1 Nov. 29, 2018

Related U.S. Application Data

(62) Division of application No. 14/020,848, filed on Sep. 8, 2013, now Pat. No. 10,038,169.

(30) Foreign Application Priority Data

Dec. 20, 2012 (KR) ........................ 10-2012-0149758

(51) Int. Cl.
*H01L 51/56* (2006.01)
*H01J 37/32* (2006.01)
*C23C 16/452* (2006.01)

(52) U.S. Cl.
CPC ............ *H01L 51/56* (2013.01); *C23C 16/452* (2013.01); *H01J 37/32357* (2013.01)

(58) Field of Classification Search
CPC ..................................................... H01L 51/56
See application file for complete search history.

(56) References Cited

U.S. PATENT DOCUMENTS 3,942,469 A 3/1976 Simhan
4,526,673 A 7/1985 Little et al.
(Continued)

FOREIGN PATENT DOCUMENTS

DE 2 361 702 A1 12/1973
DE 696 02 131 T2 12/1999
(Continued)

OTHER PUBLICATIONS

Uchida, Masao, et al., Temperature Dependence of Conductivity of Nitrogen-Containing Diamondlike Carbon Films Deposited from Pyridine, Jpn. J. Appl. Phys. vol. 35, Part 1, No. 11, pp. 5815-5819, Part 1, Nov. 1996.
Provisional double patenting rejection over claims of the U.S. Appl. No. 14/020,848; USPTO Office Action dated Feb. 20, 2015, in U.S. Appl. No. 14/250,697.
European Search Report dated Mar. 6, 2014.
(Continued)

*Primary Examiner* — Robert A Vetere
(74) *Attorney, Agent, or Firm* — Lewis Roca Rothgerber Christie LLP

(57) ABSTRACT

A vapor deposition apparatus for forming a deposition layer on a substrate, the vapor deposition apparatus includes a supply unit configured to receive a first source gas, a reaction space connected to the supply unit, a plasma generator in the reaction space, a first injection unit configured to inject a deposition source material to the substrate, the deposition source material including the first source gas, and a filament unit in the reaction space, the filament unit being connected to a power source.

23 Claims, 8 Drawing Sheets

(56) References Cited

U.S. PATENT DOCUMENTS

| | | | |
|---|---|---|---|
| 4,951,602 A | 8/1990 | Kanai | |
| 5,571,332 A * | 11/1996 | Halpern | C23C 14/22 118/723 HC |
| 5,753,886 A * | 5/1998 | Iwamura | H01J 37/32357 219/121.43 |
| 5,820,922 A * | 10/1998 | Ricco | C23C 16/18 427/125 |
| 2007/0001581 A1 | 1/2007 | Stasiak et al. | |
| 2007/0013284 A1 | 1/2007 | Lee | |
| 2008/0121514 A1 | 5/2008 | Guo et al. | |
| 2009/0081356 A1* | 3/2009 | Fedorovskaya | C23C 16/403 427/66 |
| 2009/0165715 A1 | 7/2009 | Oh | |
| 2010/0183818 A1 | 7/2010 | Hwang et al. | |
| 2010/0258247 A1* | 10/2010 | Hori | H01J 37/3244 156/345.35 |
| 2011/0203524 A1 | 8/2011 | Uno | |
| 2011/0260201 A1 | 10/2011 | Klein et al. | |
| 2012/0141676 A1 | 6/2012 | Sershen et al. | |

FOREIGN PATENT DOCUMENTS

| | | |
|---|---|---|
| EP | 0 753 081 B1 | 4/1999 |
| FR | 2 210 675 A1 | 7/1974 |
| GB | 1 454 379 | 12/1973 |
| JP | 49 89717 A | 8/1974 |
| JP | 2010-541159 A | 12/2010 |
| KR | 10-2006-0084701 A | 7/2006 |
| KR | 10-2006-0087920 A | 8/2006 |
| KR | 10-2007-0061014 A | 6/2007 |
| KR | 10-0846718 B1 | 7/2008 |
| KR | 10-2008-0114316 A | 12/2008 |
| KR | 10-2011-0056692 A | 5/2011 |
| WO | WO 96/24703 A1 | 8/1996 |

OTHER PUBLICATIONS

European Office Action dated Dec. 8, 2015.
Japanese Office Action datedAug. 29, 2017, issued during examination of corresponding Japanese Application No. 2013-261028.

* cited by examiner

VAPOR DEPOSITION APPARATUS

CROSS-REFERENCE TO RELATED PATENT APPLICATIONS

This is a divisional application based on pending application Ser. No. 14/020,848, filed Sep. 8, 2013, the entire contents of which is hereby incorporated by reference.

This application claims the benefit of Korean Patent Application No. 10-2012-0149758, filed on Dec. 20, 2012, in the Korean Intellectual Property Office, the disclosure of which is incorporated herein in its entirety by reference.

BACKGROUND

1. Field

Example embodiments relate to a vapor deposition apparatus and a method of manufacturing an organic light-emitting display apparatus. More particularly, example embodiments relate to a vapor deposition apparatus capable of efficiently processing a deposition process and easily improving a characteristic of a deposition layer, and to a method of manufacturing an organic light-emitting display apparatus using the same.

2. Description of the Related Art

Each of a semiconductor device, a display apparatus, and other electronic devices includes a plurality of thin films. In order to form the plurality of thin films, various methods may be used, e.g., a vapor deposition method.

For example, the vapor deposition method uses at least one gas as a source gas to form a thin film. The vapor deposition method may include various methods, e.g., a chemical vapor deposition (CVD), an atomic layer deposition (ALD), etc. For example, the ALD involves injecting a source gas, purging and pumping the source gas, adsorbing a single-layered atomic layer or a multi-layered atomic layer on a substrate, and then injecting another source gas, followed by purging and pumping the other source gas to form a desired single-layered or multi-layered atomic layer.

Among display apparatuses, an organic light-emitting display apparatus is advantageous with its wide viewing angle, excellent contrast ratio, and a high response time. Thus, the organic light-emitting display apparatus is regarded as a next-generation display apparatus. The organic light-emitting display apparatus includes an intermediate layer having an organic emission layer (EML) between a first electrode and a second electrode that face each other, and also includes at least one thin film. For example, in order to form the thin film of the organic light-emitting display apparatus, a deposition process may be used.

SUMMARY

Example embodiments provide a vapor deposition apparatus capable of efficiently processing a deposition process and easily improving a characteristic of a deposition layer, and a method of manufacturing an organic light-emitting display apparatus.

According to an aspect of the example embodiments, there is provided a vapor deposition apparatus for forming a deposition layer on a substrate, the vapor deposition apparatus including a supply unit configured to receive a first source gas, a reaction space connected to the supply unit, a plasma generator in the reaction space, a first injection unit configured to inject a deposition source material to the substrate, the deposition source material including the first source gas, and a filament unit in the reaction space, the filament unit being connected to a power source.

The vapor deposition apparatus may further include a support pillar in the reaction space, the filament unit being wound around the support pillar.

The filament unit may include a metal material or a ceramic material.

The filament unit may include at least one of tungsten, tantalum, titanium, $LaB_6$, BaO, and SrO.

The plasma generator may have a hollow column shape, the filament unit being inside the hollow column shape of the plasma generator.

The plasma generator may have a plurality of first holes facing the supply unit and a plurality of second holes facing the first injection unit.

The vapor deposition apparatus may further include an intermediate part with a hollow column shape, the intermediate part being between and concentric with the plasma generator and the filament unit.

The intermediate part may have a plurality of first holes facing the supply unit and a plurality of second holes facing the first injection unit.

A space may be defined between the plasma generator and a corresponding surface of the reaction space, the corresponding surface of the reaction space being an inner circumferential surface of the reaction space overlapping the plasma generator, and plasma is configured to be generated in the defined space.

The plasma generator may have an electrode form.

The vapor deposition apparatus may further include a connection unit between the reaction space and the first injection unit, the connection unit having a width less than each of the reaction space and the first injection unit.

The substrate may be closer to a ground than the vapor deposition apparatus, the first injection unit facing the ground.

The substrate may be farther from a ground than the vapor deposition apparatus, the first injection unit being in an opposite direction with respect to the ground.

The substrate and the vapor deposition apparatus may be configured to move relatively to each other.

The vapor deposition apparatus may further include a second injection unit adjacent to the first injection unit, the second injection unit being separated from the first injection unit.

The second injection unit may be configured to inject a purge gas or a second source material toward the substrate.

The vapor deposition apparatus may further include a second injection unit and a third injection unit adjacent to the first injection unit, each of the second and third injection units being separated from the first injection unit, and the first injection unit being between the second and third injection units.

Each of the second injection unit and the third injection unit may be configured to inject toward the substrate one of a purge gas, a second source material, and a third source material.

The vapor deposition apparatus may further include a plurality of exhaustion units adjacent to the first injection unit, the second injection unit, and the third injection unit, respectively.

The plurality of exhaustion units may include a first exhaustion unit between the first injection unit and the second injection unit, and a second exhaustion unit between the first injection unit and the third injection unit.

According to another aspect of the example embodiments, there is provided a vapor deposition apparatus for forming a deposition layer on a substrate, the vapor deposition apparatus including a plurality of first regions, each of the plurality of first regions including a supply unit configured to receive a first source gas, a reaction space connected to the supply unit, a plasma generator in the reaction space, a first injection unit configured to inject a deposition source material to the substrate, the deposition source material including the first source gas, and a filament unit in the reaction space, the filament unit being connected to a power source, a plurality of second regions, each of the plurality of second regions being configured to inject a second source material being toward the substrate, and a plurality of purge parts, the plurality of purge parts being configured to inject a purge gas toward the substrate.

Each of the plurality of purge parts may be between the first region and the second region.

The vapor deposition apparatus may further include a plurality of exhaustion units adjacent to the first region, the second region, and the purge part.

According to another aspect of the example embodiments, there is provided a deposition method for forming a deposition layer on a substrate, the method including supplying a first source gas from a supply unit to a reaction space, generating plasma by using a plasma generator disposed in the reaction space, activating the first source gas in the reaction space by using a filament unit in the reaction space and connected to a power source, such that at least a portion of the first source gas in the reaction space is changed into a radical status, and injecting a first source deposition material to the substrate, the first source deposition material including the first source gas in the radical status.

Using the filament unit may include emitting heat and thermal electrons to activate the first source gas.

A deposition process may be performed while the substrate and the vapor deposition apparatus move relatively to each other.

According to another aspect of the example embodiments, there is provided a method of manufacturing an organic light-emitting display apparatus, the method including disposing a substrate to correspond to a vapor deposition apparatus, and forming a thin film on the substrate, the thin film being at least one of a first electrode, an intermediate layer having an organic emission layer, a second electrode, and an encapsulation layer, and forming the thin film include supplying a first source gas from a supply unit to a reaction space, generating plasma by using a plasma generator disposed in the reaction space, activating the first source gas in the reaction space by using a filament unit that in the reaction space and connected to a power source, such that at least a portion of the first source gas in the reaction space is changed into a radical status, and injecting a first source deposition material to the substrate, the first source deposition material including the first source gas in the radical status.

Forming the thin film may include forming the encapsulation layer on the second electrode.

Forming the thin film may include forming an insulating layer.

Forming the thin film may include forming a conductive layer.

BRIEF DESCRIPTION OF THE DRAWINGS

The above and other features and advantages of the example embodiments will become more apparent by describing in detail exemplary embodiments thereof with reference to the attached drawings, in which.

DETAILED DESCRIPTION

Figure 1:
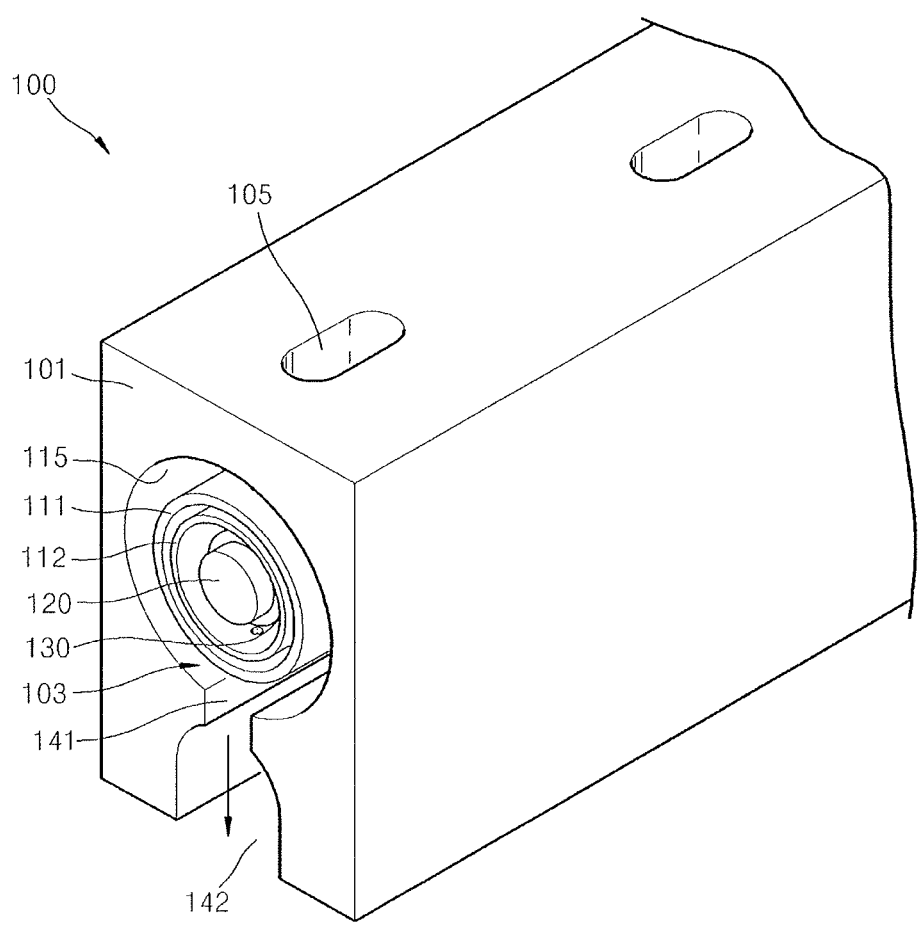
FIG. 1 is a perspective view of a vapor deposition apparatus according to an embodiment.

Hereinafter, example embodiments will be described in detail with reference to FIGS. 1-3. FIG. 1 is a perspective view of a vapor deposition apparatus 100 according to an embodiment, FIG. 2 is an exploded perspective view of the vapor deposition apparatus 100, and FIG. 3 is a front view of the vapor deposition apparatus 100.

Figure 2:
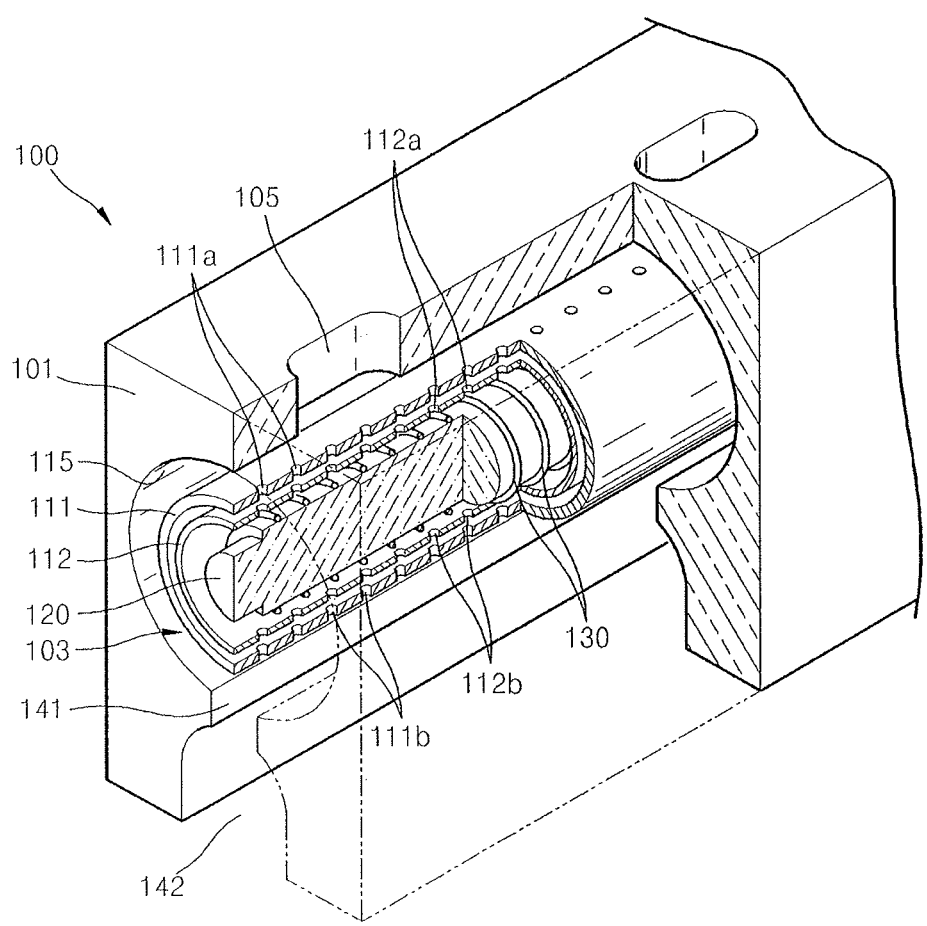
FIG. 2 is an exploded perspective view of the vapor deposition apparatus of FIG. 1.
Figure 3:
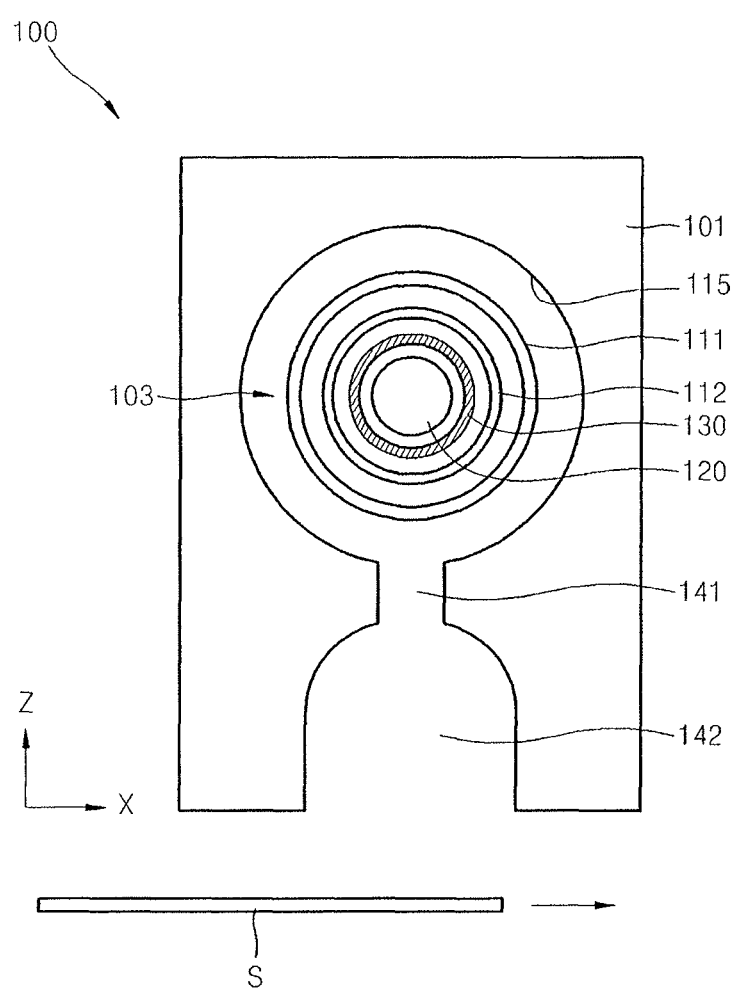
FIG. 3 is a front view of the vapor deposition apparatus of FIG. 1.

Referring to FIGS. 1 through 3, the vapor deposition apparatus 100 includes a housing 101, a supply unit 105, a reaction space 103, a plasma generator 111, an injection unit 142, and a filament unit 130.

The housing 101 is formed of a material having durability so as to maintain an entire shape and appearance of the vapor deposition apparatus 100. Although FIG. 1 illustrates the housing 101 that is similar to a rectangular parallelepiped, a shape of the housing 101 is not limited thereto.

The supply unit 105 is arranged at an upper portion of the housing 101, and is a through-hole so as to supply one or more source gases. The number of the supply units 105 may vary according to a size of a deposition target to which a deposition process is performed.

The reaction space 103 is connected with the supply unit 105 and is defined as a space in, e.g., within, the housing 101. For example, the reaction space 103 may have a cylindrical shape, e.g., the reaction space 103 may be a hollow channel inside the housing 101, and may be in fluid communication with the supply unit 105.

The injection unit 142 is connected to the reaction space 103. That is, the reaction space 103 is arranged between the supply unit 105 and the injection unit 142. In detail, the source gas is input via the supply unit 105 into the reaction space 103, where the source gas is changed into a desired status, e.g., into a reaction product. Then, the reaction product from the reaction space 103 is delivered to the injection unit 142 to react with the deposition target in the injection unit 142, i.e., the deposition process is performed on a surface of the deposition target. For example, the injection unit 142 may be connected to the reaction space 103 via a connection unit 141, e.g., the connection unit 141 may have a width that is less than a width of each of the injection unit 142 and the reaction space 103. For example, the source gas may be changed to a radical status, so a deposition source material in the radical status may be effectively delivered to the injection unit 142.

The plasma generator 111 is disposed in the reaction space 103. In detail, the plasma generator 111 may have an electrode form having a voltage applied thereto. Also, the plasma generator 111 may have a hollow column shape. In particular, the plasma generator 111 may have a hollow cylindrical-column shape having a curved outer surface.

A surface 115 defining an inner circumferential surface of the reaction space 103 corresponds to the plasma generator 111, e.g., the surface 115 may overlap the plasma generator 111. For example, the surface 115 may be that of a ground electrode. Therefore, plasma may be generated in a space between the plasma generator 111 and the corresponding surface 115. The source gas that is input via the supply unit 105 into the reaction space 103 is changed to a radical status in the space between the plasma generator 111 and the corresponding surface 115, so that a deposition characteristic of the source gas is improved.

The plasma generator 111 includes at least one first hole 111a and at least one second hole 111b. In more detail, the plasma generator 111 includes a plurality of the first holes 111a and a plurality of the second holes 111b. The first holes 111a are formed in a top surface of the plasma generator 111 in a direction close to the supply unit 105, and the second holes 111b are formed in a bottom surface of the plasma generator 111 in a direction close to the injection unit 142.

The filament unit 130 is disposed in the reaction space 103. In more detail, the filament unit 130 is disposed in the plasma generator 111. That is, the filament unit 130 is disposed inside the hollow cylindrical-column shape of the plasma generator 111. Although not illustrated, a power (not shown) is connected to the filament unit 130 so as to apply voltage thereto, thereby causing thermionic emission, i.e., emission of heat and thermal electrons, from the filament unit 130. Also, the heat and thermal electrons collide with gas around the filament unit 130, thereby generating secondary electrons.

The filament unit 130 may be formed of various materials including a metal material or a ceramic material which has a high electron emission coefficient. Examples of metal materials may include tungsten, tantalum, or titanium, and examples of ceramic materials may include $LaB_6$, BaO or SrO.

The filament unit 130 is supported by a support pillar 120. For example, as illustrated in FIG. 3, the filament unit 130 and the support pillar 120 may be separated, e.g., spaced apart, from each other. In another example, as illustrated in FIG. 2, the filament unit 130 and the support pillar 120 may directly contact each other at predetermined regions. By doing so, the filament unit 130 may be stably disposed on the support pillar 120, e.g., the filament unit 130 may be wound around the support pillar 120 multiple times.

An intermediate part 112 is disposed between the plasma generator 111 and the filament unit 130. That is, similarly to the plasma generator 111, the intermediate part 112 has a hollow cylindrical-column shape. Also, the intermediate part 112 has at least one first hole 112a and at least one second hole 112b. In more detail, the intermediate part 112 has a plurality of the first holes 112a and a plurality of the second holes 112b, e.g., the first holes 112a may be formed in a top surface of the intermediate part 112 in a direction close to the supply unit 105 and the second holes 112b may be formed in a bottom surface of the intermediate part 112 in a direction close to the injection unit 142. Also, the first holes 112a of the intermediate part 112 may correspond to the first holes 111a of the plasma generator 111, and the second holes 112b of the intermediate part 112 may correspond to the second holes 111b of the plasma generator 111.

With reference to FIG. 3, a deposition method using the vapor deposition apparatus 100 is briefly described below.

When a substrate S, i.e., a deposition target, is disposed to correspond to the injection unit 142 of the vapor deposition apparatus 100, a deposition process is performed on the substrate S. Here, the deposition process may be performed while the substrate S and the vapor deposition apparatus 100 relatively move with respect to each other. For example, as illustrated in FIG. 3, the deposition process may be performed while the substrate S is moved in an X-axis direction of FIG. 3. In another example, the vapor deposition apparatus 100 may move. However, in another embodiment, the deposition process may be performed while the substrate S is fixed with respect to the vapor deposition apparatus 100.

First, at least one source gas is input to the reaction space 103 via the supply unit 105. Here, plasma is generated between the plasma generator 111 and the corresponding surface 115 of the reaction space 103, and at least some portion of the source gas that is input to the reaction space 103 is changed to a radical status.

Here, a voltage is applied to the filament unit 130 via a power (not shown) so that heat is generated in the filament unit 130. Also, the filament unit 130 is formed of a material having a high electron emission coefficient, thereby emitting thermal electrons. The generated heat and thermal electrons facilitate a process in which the source gas that is input to the reaction space 103 is changed to the radical status. That is, an amount of source gas changed into the radical status is increased, and a speed of the change is accelerated. In particular, as the filament unit 130 has a surface temperature of at least 1500° C. when power is applied thereto, heat radiating from the filament unit 130 increases the efficiency of change from the source gas to the radical status.

Also, as the heat and thermal electrons emitted from the filament unit 130 collide with gas in an adjacent region, i.e., the source gas and an inert gas for plasma generation, the heat and thermal electrons generate secondary electrons. In this regard, the secondary electrons also increase the efficiency of the change from the source gas to the radical status.

In order to allow the source gas to effectively react with the heat and thermal electrons emitted from the filament unit 130, the first holes 111a and the second holes 111b are formed in the plasma generator 111. That is, the source gas easily reaches the filament unit 130 via the first holes 111a and the second holes 111b of the plasma generator 111.

The intermediate part 112 that is disposed between the plasma generator 111 and the filament unit 130 allows source gases to be uniformly supplied. In particular, the first holes 112a and the second holes 112b of the intermediate part 112 facilitate movement of the source gases so as to allow the source gases to uniformly correspond to the filament unit 130 without local gathering. Also, a source in the radical status is easily exhausted via the first holes 112a and the second holes 112b of the intermediate part 112, and then is uniformly delivered to the injection unit 142.

The source in the radical status reaches a surface of the substrate S, so that a desired deposition layer is formed.

According to the present embodiment, when the vapor deposition apparatus 100 changes the source gas to the radical status by using the plasma generator 111, the vapor deposition apparatus 100 uses the filament unit 130 so that the source gas is easily activated. By doing so, the efficiency of the change from the source gas to the radical status is increased, so that a characteristic of the deposition layer is easily improved.

Figure 4:
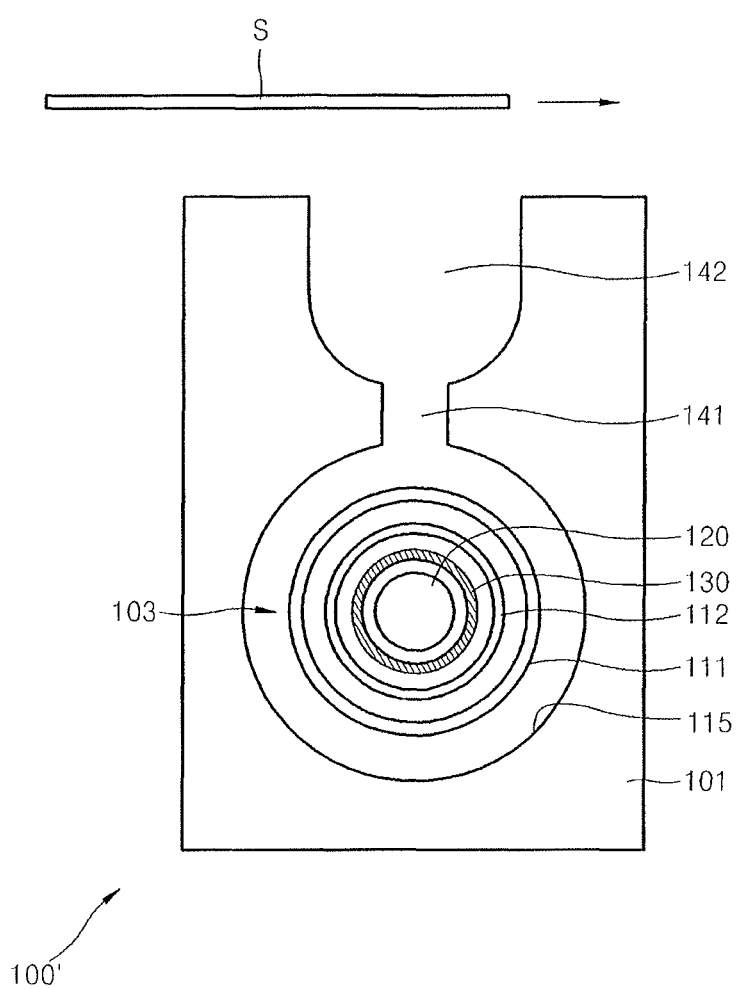
FIG. 4 is a plane view of a vapor deposition apparatus according to another embodiment.

FIG. 4 is a plane view of a vapor deposition apparatus 100' according to another embodiment. For convenience of description, the present embodiment is described with reference to differences relative to the previous embodiment.

Referring to FIG. 4, the vapor deposition apparatus 100' includes the housing 101, the supply unit 105, the reaction space 103, the plasma generator 111, the injection unit 142, and the filament unit 130.

In the previous embodiment, the deposition process is performed while the substrate S is disposed below the vapor deposition apparatus 100. That is, the vapor deposition apparatus 100 is disposed farther from a ground than the substrate S. Thus, the injection unit 142 of the vapor deposition apparatus 100 injects the source in the radical status toward a ground direction.

However, one or more embodiments of the example embodiments are not limited thereto. That is, as illustrated in FIG. 4, a deposition process may be performed while a substrate S is disposed above the vapor deposition apparatus 100'. That is, the vapor deposition apparatus 100' is disposed closer to a ground than the substrate S. Thus, the injection unit 142 of the vapor deposition apparatus 100' injects the source in the radical status in an opposite direction with respect to the ground.

Figure 5:
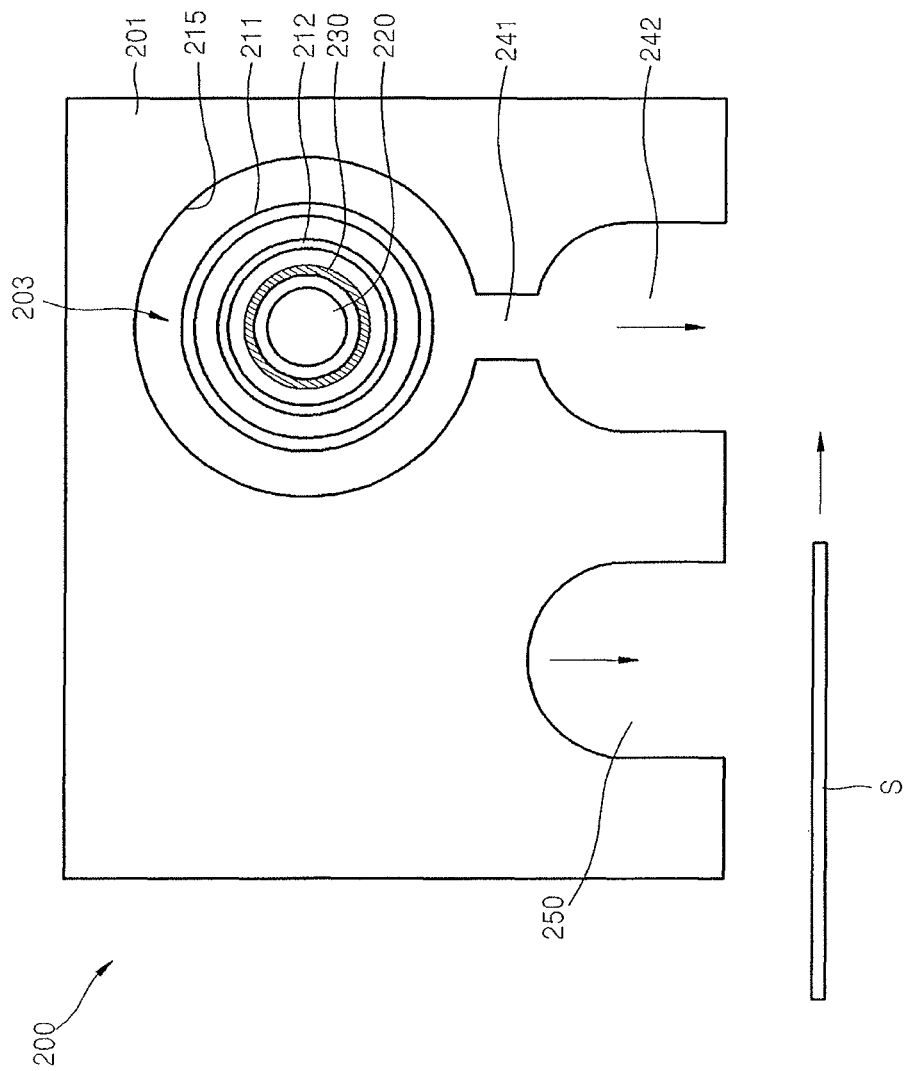
FIG. 5 is a plane view of a vapor deposition apparatus according to another embodiment.

FIG. 5 is a plane view of a vapor deposition apparatus 200 according to another embodiment. Referring to FIG. 5, the vapor deposition apparatus 200 includes a housing 201, a supply unit (not shown), a reaction space 203, a plasma generator 211, a first injection unit 242, a filament unit 230, and a second injection unit 250.

The housing 201 is formed of a material having durability so as to maintain an entire shape and appearance of the vapor deposition apparatus 200.

The supply unit is disposed in the housing 201, e.g., the supply unit may be disposed in an upper portion of the housing 201 and may include a plurality of through-holes so as to supply a first source gas to the reaction space 203 and to supply a second source gas to the second injection unit 250. The reaction space 203 may be connected with the supply unit and is defined as a predetermined space in the housing 201, e.g., the reaction space 203 may have a cylindrical shape.

The first injection unit 242 is connected to the reaction space 203. That is, the reaction space 203 is arranged between the supply unit and the first injection unit 242. The first source gas input via the supply unit is changed to a desired status in the reaction space 203, is delivered to the first injection unit 242, and reacts with a deposition target in the first injection unit 242, so that a deposition process is performed on a surface of the deposition target. The first injection unit 242 may be connected to the reaction space 203 via a connection unit 241, e.g., the connection unit 241 may have a width that is less than a width of each of the first injection unit 242 and the reaction space 203.

The plasma generator 211 is disposed in the reaction space 203. In more detail, the plasma generator 211 may have an electrode form having a voltage applied thereto. Also, the plasma generator 211 may have a hollow column shape. In particular, the plasma generator 211 may have a hollow cylindrical-column shape having a curved outer surface.

Also, a corresponding surface 215 that is defined as an inner circumferential surface of the reaction space 203 is a member that corresponds to the plasma generator 211, e.g., the corresponding surface 215 may be a ground electrode. By doing so, plasma may be generated in a space between the plasma generator 211 and the corresponding surface 215.

The source gas that is input via the supply unit is changed to a radical status in the space between the plasma generator 211 and the corresponding surface 215, so that a deposition characteristic of the source gas is improved.

The plasma generator 211 includes a first hole (not shown) and a second hole (not shown) and is the same as that in the embodiment of FIGS. 1-3. Thus, detailed descriptions are omitted here.

The filament unit 230 is disposed in the reaction space 203. In more detail, the filament unit 230 is disposed in the plasma generator 211. That is, the filament unit 230 is disposed in a space of the plasma generator 211 having the hollow cylindrical-column shape. Although not illustrated, a power (not shown) is connected to the filament unit 230 so as to apply a voltage thereto. By doing so, heat and thermal electron emission are emitted from the filament unit 230. Also, the heat and thermal electron emission collide with a gas around the filament unit 230, thereby generating secondary electrons.

The filament unit 230 may be formed of various materials exhibiting high electron emission coefficient, e.g., a metal material or a ceramic material. Examples of metal materials include tungsten, tantalum, or titanium, and examples of ceramic materials include $LaB_6$, BaO or SrO.

The filament unit 230 is supported by a support pillar 220. The filament unit 230 is the same as that in the embodiment of FIGS. 1-3. Thus, detailed descriptions are omitted here.

An intermediate part 212 is disposed between the plasma generator 211 and the filament unit 230. That is, similarly to the plasma generator 211, the intermediate part 212 has a hollow cylindrical-column shape. Also, the intermediate part 212 has a first hole (not shown) and a second hole (not shown) and is the same as that in the previous embodiment, thus, detailed descriptions are omitted here.

The second injection unit 250 is formed adjacent to the first injection unit 242. Also, the second injection unit 250 may be separated from the first injection unit 242. The second injection unit 250 injects a second source material to be deposited on the substrate S toward the substrate S. Although not illustrated, the second injection unit 250 is connected with a supply unit so as to receive the second source material, e.g., the supply unit for the second injection unit 250 may be formed separately from the supply unit (not shown) that supplies the first source material to the reaction space 203.

A deposition method using the vapor deposition apparatus 200 is briefly described below.

When the substrate S, i.e., the deposition target, is disposed to correspond to the second injection unit 250 of the vapor deposition apparatus 200, the second injection unit 250 injects the second source material, i.e., the second source material in a gas status, toward the substrate S.

Afterward, when the substrate S is moved in the X-axis direction of FIG. 5, i.e., along an arrow direction, to correspond to the first injection unit 242 of the vapor deposition apparatus 200, the first source gas is input to the reaction space 203. Here, plasma is generated between the plasma generator 211 and the corresponding surface 215 of the reaction space 203, and at least some portion of the first source gas that is input to the reaction space 203 is changed to a radical status.

Here, a voltage is applied to the filament unit 230 via a power (not shown) so that heat is generated in the filament unit 230. Also, the filament unit 230 is formed of a material having a high electron emission coefficient, thereby emitting a thermal electron emission. The heat and thermal electron emission facilitate a process in which the first source gas that is input to the reaction space 203 is changed to the radical status. That is, an amount of the change from the first source gas to the radical status is increased, and a speed of the change is accelerated. In particular, radiant heat from the filament unit 230, having a surface temperature of at least 1500° C., increases an efficiency of the change from the first source gas to the radical status.

Also, the heat and thermal electrons emitted from the filament unit 230 collide with a gas in an adjacent region, i.e., the source gas and an inert gas for plasma generation, so that the heat and thermal electron generate a secondary electron emission. In this regard, the secondary electron emission also increases the efficiency of the change from the first source gas to the radical status.

The intermediate part 212 that is disposed between the plasma generator 211 and the filament unit 230 allows source gases to be uniformly supplied. A source in the radical status reaches a surface of the substrate S, so that a desired deposition layer is formed. Accordingly, the deposition layer including the first source material and the second source material is formed on the substrate S. For example, a single-layered deposition layer including the first source material and the second source material may be formed on the substrate S.

However, example embodiments are not limited thereto. That is, the second injection unit 250 may not inject the second source material for deposition but may inject a purge gas that does not involve the deposition.

According to the present embodiment, when the vapor deposition apparatus 200 changes the source gas to the radical status by using the plasma generator 211, the vapor deposition apparatus 200 uses the filament unit 230 so that the source gas is easily activated. By doing so, the efficiency of the change from the source gas to the radical status is increased, so that a characteristic of the deposition layer is easily improved.

Here, the deposition process may be performed while the substrate S and the vapor deposition apparatus 200 move relatively to each other. For example, as illustrated in FIG. 5, the deposition process may be performed while the substrate S is moved in an X-axis direction of FIG. 5, e.g., while the vapor deposition apparatus 200 is stationary, or vice versa. In another example, the deposition process may be performed while the substrate S is fixed with respect to the vapor deposition apparatus 200. Also, as in the previous embodiment of FIG. 4, positions of the substrate S and the vapor deposition apparatus 200 may be switched.

Figure 6:
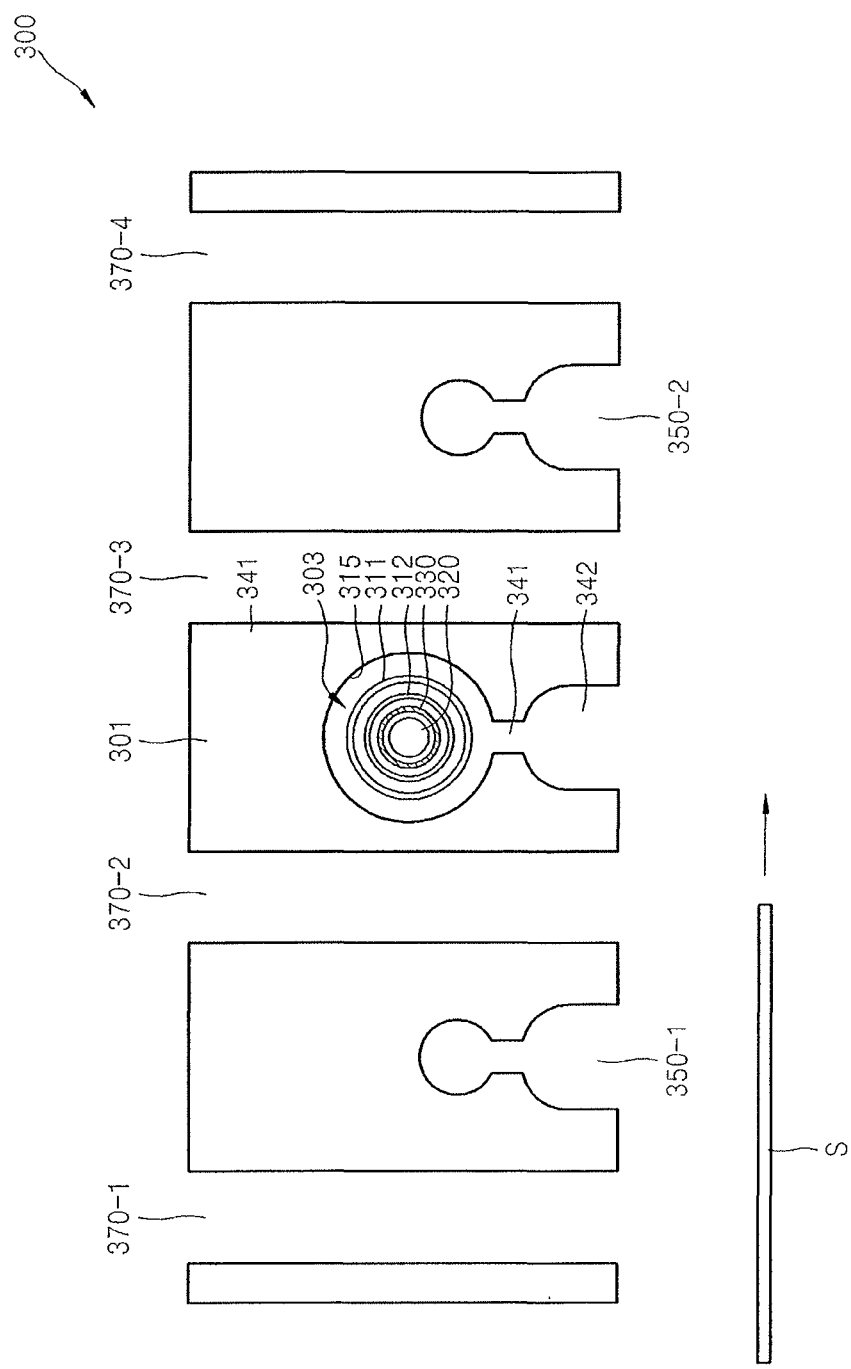
FIG. 6 is a plane view of a vapor deposition apparatus according to another embodiment.

FIG. 6 is a plane view of a vapor deposition apparatus 300 according to another embodiment. Referring to FIG. 6, the vapor deposition apparatus 300 includes a housing 301, a supply unit (not shown), a reaction space 303, a plasma generator 311, a first injection unit 342, a filament unit 330, a second injection unit 350-1, and a third injection unit 350-2. Also, the vapor deposition apparatus 300 includes a plurality of exhaustion units, e.g., exhaustion units 370-1, 370-2, 370-3, and 370-4.

The housing 301 is formed of a material having durability so as to maintain an entire shape and appearance of the vapor deposition apparatus 300.

The supply unit is disposed in the housing 301, e.g., the supply unit may be disposed in an upper portion of the housing 301 and may include a plurality of through-holes so as to supply a first source gas to the reaction space 203 and to supply a plurality of source gases to the second injection unit 350-1 and the third injection unit 350-2. The reaction space 303 may be connected with the supply unit and is defined as a predetermined space in the housing 301. In more detail, the reaction space 303 may have a cylindrical shape.

The first injection unit 342 is connected to the reaction space 303. That is, the reaction space 303 is arranged between the supply unit and the first injection unit 342. The first source gas input via the supply unit is changed to a desired status in the reaction space 303, is delivered to the first injection unit 342, and reacts with a deposition target in the first injection unit 342, so that a deposition process is performed on a surface of the deposition target. The first injection unit 342 may be connected to the reaction space 303 via a connection unit 341, e.g., the connection unit 341 may have a width that is less than a width of each of the first injection unit 342 and the reaction space 303.

The plasma generator 311 is disposed in the reaction space 303. In more detail, the plasma generator 311 may have an electrode form having a voltage applied thereto. Also, the plasma generator 311 may have a hollow column shape. In particular, the plasma generator 311 may have a hollow cylindrical-column shape having a curved outer surface.

Also, a corresponding surface 315 that is defined as an inner circumferential surface of the reaction space 303 is a member that corresponds to the plasma generator 311, e.g., the corresponding surface 315 may be a ground electrode. By doing so, plasma may be generated in a space between the plasma generator 311 and the corresponding surface 315. The source gas that is input via the supply unit is changed to a radical status in the space between the plasma generator 311 and the corresponding surface 315, so that a deposition characteristic of the source gas is improved.

The plasma generator 311 includes a first hole (not shown) and a second hole (not shown) and is the same as that in the previous embodiment, thus, detailed descriptions are omitted here.

The filament unit 330 is disposed in the reaction space 303. In more detail, the filament unit 330 is disposed in the plasma generator 311. That is, the filament unit 330 is disposed in a space of the plasma generator 311 having the hollow cylindrical-column shape. Although not illustrated, a power (not shown) is connected to the filament unit 330 so as to apply a voltage thereto. By doing so, heat and thermal electron emission are emitted from the filament unit 330. Also, the heat and thermal electrons collide with a gas around the filament unit 330, thereby generating a secondary electron.

The filament unit 330 may be formed of various materials, e.g., a metal material or a ceramic material, which has a high electron emission coefficient. The metal material includes, e.g., at least one of tungsten, tantalum, and titanium, and the ceramic material includes, e.g., at least one of $LaB_6$, BaO, and SrO.

The filament unit 330 is supported by a support pillar 320. The filament unit 330 is the same as that in the previous embodiment, thus, detailed descriptions are omitted here.

An intermediate part 312 is disposed between the plasma generator 311 and the filament unit 330. That is, similar to the plasma generator 311, the intermediate part 312 has a hollow cylindrical-column shape. Also, the intermediate part 312 has a first hole (not shown) and a second hole (not shown) and is the same as that in the previous embodiment, thus, detailed descriptions are omitted here.

The second injection unit 350-1 is formed adjacent to the first injection unit 342. Also, the second injection unit 350-1 may be separated from the first injection unit 342. The second injection unit 350-1 injects a purge gas toward the substrate S. The purge gas includes an inert gas. Also, in another embodiment, the second injection unit 350-1 may inject a second source material to be deposited on the substrate S in the direction toward the substrate S. Although not illustrated, the second injection unit 350-1 is connected with a supply unit so as to receive the purge gas or the second source material, e.g., the supply unit for the second injection unit 350-1 may be separately formed from the supply unit (not shown) that supplies a first source material to the reaction space 303.

The third injection unit 350-2 is formed adjacent to the first injection unit 342. Also, the third injection unit 350-2 may be separated from the first injection unit 342. In more detail, the first injection unit 342 is disposed between the second injection unit 350-1 and the third injection unit 350-2. The third injection unit 350-2 injects a purge gas toward the substrate S. The purge gas includes an inert gas. Also, in another embodiment, the third injection unit 350-2 may inject the second source material to be deposited on the substrate S in the direction toward the substrate S. Also, the third injection unit 350-2 may inject a third source material to be deposited on the substrate S in the direction toward the substrate S.

Also, the exhaustion unit 370-2 is disposed between the first injection unit 342 and the second injection unit 350-1, and the exhaustion unit 370-3 is disposed between the first injection unit 342 and the third injection unit 350-2. Also, the exhaustion unit 370-1 and the exhaustion unit 370-4 are disposed adjacent to side edges of the second injection unit 350-1 and the third injection unit 350-2, respectively.

The exhaustion units 370-1, 370-2, 370-3, and 370-4 are disposed adjacent to the first injection unit 342, the second injection unit 350-1, and the third injection unit 350-2, and exhaust a material that remains in the deposition process using the first injection unit 342, the second injection unit 350-1, and the third injection unit 350-2, so that a characteristic of a deposition layer is improved.

According to the present embodiment, when the vapor deposition apparatus 300 changes the source gas to the radical status by using the plasma generator 311, the vapor deposition apparatus 300 uses the filament unit 330 so that the source gas is easily activated. By doing so, the efficiency of the change from the source gas to the radical status is increased, so that a characteristic of the deposition layer is easily improved.

Here, the deposition process may be performed while the substrate S and the vapor deposition apparatus 300 relatively move with respect to each other. That is, as illustrated in FIG. 6, the deposition process may be performed while the substrate S is moved in an X-axis direction of FIG. 6, or conversely, the vapor deposition apparatus 200 may move. However, in another embodiment of the example embodiments, the deposition process may be performed while the substrate S is fixed with respect to the vapor deposition apparatus 600.

Also, according to the present embodiment, the vapor deposition apparatus 300 includes the second injection unit 350-1 and the third injection unit 350-2, thereby easily preventing foreign substances or gases from flowing into a deposition process region when the deposition process is performed via the first injection unit 342.

As in the previous embodiment of FIG. 4, positions of the substrate S and the vapor deposition apparatus 300 may be switched.

Figure 7:
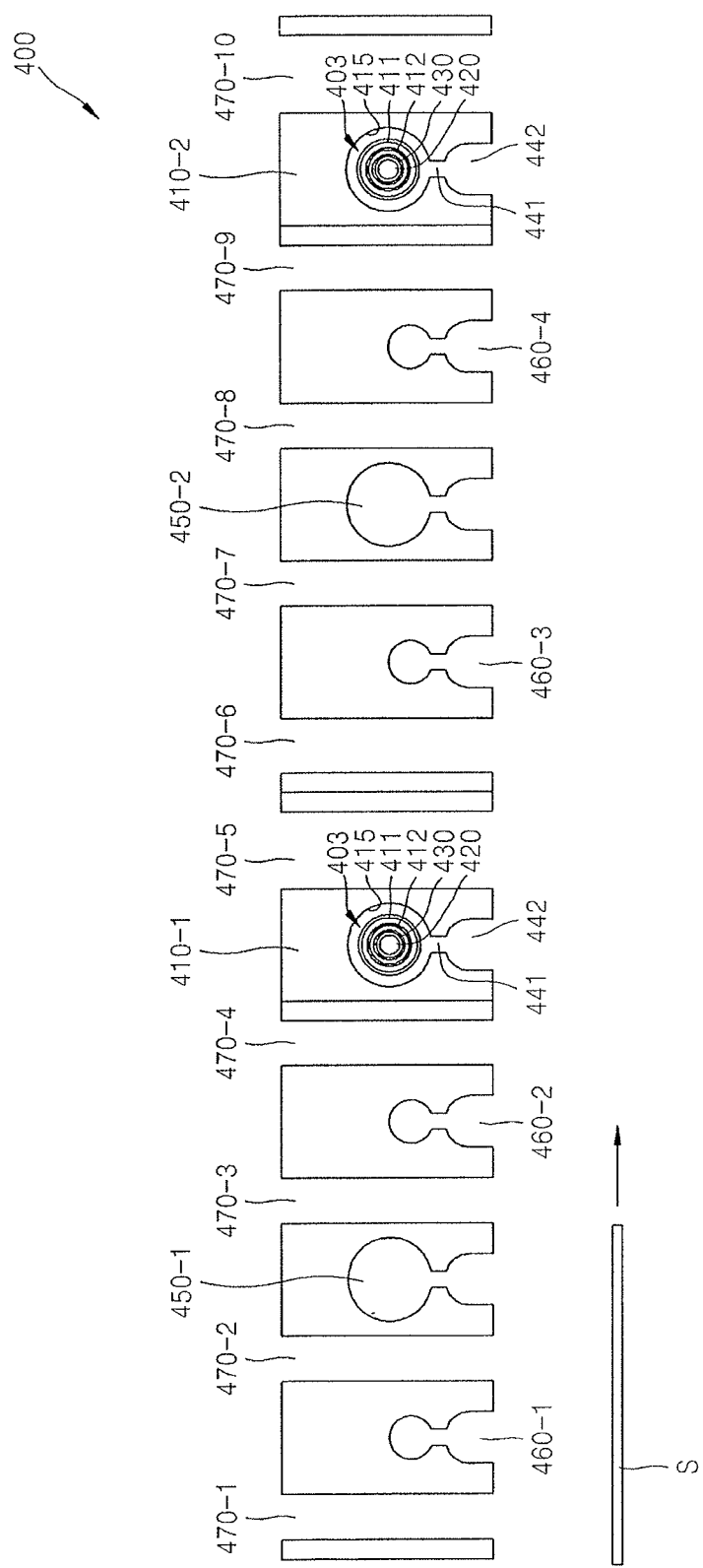
FIG. 7 is a plane view of a vapor deposition apparatus according to another embodiment.

FIG. 7 is a plane view of a vapor deposition apparatus 400 according to another embodiment.

Referring to FIG. 7, the vapor deposition apparatus 400 includes a plurality of first regions 410-1 and 410-2, a plurality of second regions 450-1 and 450-2, a plurality of purge parts 460-1, 460-2, 460-3, and 460-4, and a plurality of exhaustion units 470-1, 470-2, 470-3 . . . 470-8, 470-9, and 470-10.

Each of the first regions 410-1 and 410-2 includes a housing 401, a supply unit (not shown), a reaction space 403, a plasma generator 411, a first injection unit 442, a filament unit 430, and a second injection unit 450.

The housing 401 is formed of a material having durability so as to maintain not only an entire shape and appearance of the first region 410-1 but also to maintain an entire shape and appearance of the vapor deposition apparatus 400. That is, the housing 401 may be formed while corresponding to each of the first regions 410-1 and 410-2, and to an entire portion of the vapor deposition apparatus 400.

Since the first regions 410-1 and 410-2 have the same configuration, the configuration of the first region 410-1 is only described below.

The supply unit is disposed in the housing 401, e.g., the supply unit may be disposed in an upper portion of the housing 401 and may supply a first source gas to the reaction space 403. The reaction space 403 may be connected with the supply unit and is defined as a predetermined space in the housing 401. In more detail, the reaction space 403 may have a cylindrical shape.

The first injection unit 442 is connected to the reaction space 403. That is, the reaction space 403 is arranged between the supply unit and the first injection unit 442.

The first injection unit 442 is connected to the reaction space 403. That is, the reaction space 403 is arranged between the supply unit and the first injection unit 442. The first source gas input via the supply unit is changed to a desired status in the reaction space 403, is delivered to the first injection unit 442, and reacts with a deposition target in the first injection unit 442, so that a deposition process is performed on a surface of the deposition target. The first injection unit 442 may be connected to the reaction space 403 via a connection unit 441, and in this regard, the connection unit 441 may have a width that is less than a width of each of the first injection unit 442 and the reaction space 403.

The plasma generator 411 is disposed in the reaction space 403. In more detail, the plasma generator 411 may have an electrode form having a voltage applied thereto. Also, the plasma generator 411 may have a hollow column shape. In particular, the plasma generator 411 may have a hollow cylindrical-column shape having a curved outer surface.

Also, a corresponding surface 415 that is defined as an inner circumferential surface of the reaction space 403 is a member that corresponds to the plasma generator 411, and for example, the corresponding surface 415 may be a ground electrode. By doing so, plasma may be generated in a space between the plasma generator 411 and the corresponding surface 415. The source gas that is input via the supply unit is changed to a radical status in the space between the plasma generator 411 and the corresponding surface 415, so that a deposition characteristic of the source gas is improved.

The plasma generator 411 includes a first hole (not shown) and a second hole (not shown) and is the same as that in the previous embodiment, thus, detailed descriptions are omitted here.

The filament unit 430 is disposed in the reaction space 403. In more detail, the filament unit 430 is disposed in the plasma generator 411. That is, the filament unit 430 is disposed in a space of the plasma generator 411 having the hollow cylindrical-column shape. Although not illustrated, a power (not shown) is connected to the filament unit 430 so as to apply a voltage thereto. By doing so, heat and thermal electron are emitted from the filament unit 430. Also, the heat and thermal electron collide with a gas around the filament unit 430, thereby generating a secondary electron.

The filament unit 430 may be formed of various materials, including a metal material or a ceramic material, which has a high electron emission coefficient. The metal material includes tungsten, tantalum, or titanium, and the ceramic material includes $LaB_6$, BaO or SrO.

The filament unit 430 is supported by a support pillar 420. The filament unit 430 is the same as that in the previous embodiment, thus, detailed descriptions are omitted here.

An intermediate part 412 is disposed between the plasma generator 411 and the filament unit 430. That is, similar to the plasma generator 411, the intermediate part 412 has a hollow cylindrical-column shape. Also, the intermediate part 412 has a first hole (not shown) and a second hole (not shown) and is the same as that in the previous embodiment, thus, detailed descriptions are omitted here.

The second regions 450-1 and 450-2 are separated from the first regions 410-1 and 410-2, respectively. Also, a second source material to be deposited on a substrate S is injected toward the substrate S via each of the second regions 450-1 and 450-2.

The purge parts 460-1, 460-2, 460-3, and 460-4 are disposed adjacent to the first regions 410-1 and 410-2 and the second regions 450-1 and 450-2, respectively. In more detail, the purge part 460-2 is disposed between the first region 410-1 and the second region 450-1, the purge part 460-3 is disposed between the first region 410-1 and the second region 450-2, and the purge part 460-4 is disposed between the first region 410-2 and the second region 450-2. Also, the purge part 460-1 is disposed to be adjacent to the second region 450-1. The purge parts 460-1, 460-2, 460-3, and 460-4 inject a purge gas including an inert gas toward the substrate S.

The exhaustion units 470-1, 470-2, 470-3 . . . 470-8, 470-9, and 470-10 are disposed adjacent to the first regions 410-1 and 410-2, the second regions 450-1 and 450-2, and the purge parts 460-1, 460-2, 460-3, and 460-4, respectively. That is, the exhaustion units 470-1, 470-2, 470-3 . . . 470-8, 470-9, and 470-10 are disposed between the first regions 410-1 and 410-2, the second regions 450-1 and 450-2, and the purge parts 460-1, 460-2, 460-3, and 460-4, respectively. While FIG. 7 illustrates a case in which the two exhaustion units 470-5 and 470-6 are disposed between the first region 410-1 and the purge part 460-3, the one or more embodiments of the example embodiments are not limited thereto and thus, one of the two exhaustion units 470-5 and 470-6 may be skipped.

A deposition method using the vapor deposition apparatus 400 is briefly described below. In more detail, the deposition method involves forming $Al_xO_y$ on the substrate S by using the vapor deposition apparatus 400.

When the substrate S that is a deposition target is disposed to correspond to the second region 450-1 of the vapor deposition apparatus 400, a second source material, e.g., a gas including an aluminum (Al) atom such as trimethyl aluminum (TMA) in a gas status, may be injected from the second region 450-1 toward the substrate S. By doing so, an adsorbent layer including Al is formed on a top surface of the substrate S. In more detail, a chemical adsorbent layer and a physical adsorbent layer are formed on the top surface of the substrate S.

The physical adsorbent layer having low coherence among molecules on the top surface of the substrate S is detached from the substrate S due to the purge gas injected by the purge part 460-1 or the purge part 460-2, and is effectively removed from the substrate S via a pumping operation by the exhaustion units 470-2 and 470-3, so that purity of a deposition layer to be finally formed on the substrate S is increased.

Afterward, when the substrate S that is the deposition target is moved in an X-axis direction of FIG. 7, i.e., an arrow direction, and then is disposed while corresponding to the first injection unit 442 of the first region 410-1 of the vapor deposition apparatus 400, the first source gas is input to the reaction space 403. In more detail, the first source gas may include oxygen, e.g., at least one of $H_2O$, $O_2$, $N_2O$, etc.

Here, plasma is generated between the plasma generator 411 and the corresponding surface 415 of the reaction space 403, and at least some portion of an oxygen component of the first source gas that is input to the reaction space 403 is changed to a radical status.

Here, a voltage is applied to the filament unit 430 via a power (not shown) so that heat is generated in the filament unit 430. Also, the filament unit 430 is formed of a material having a high electron emission coefficient, thereby emitting a thermal electron. The heat and thermal electron facilitate a process in which the first source gas that is input to the reaction space 403 is changed to the radical status. That is, an amount of the change from the source gas to the radical status is increased, and a speed of the change is accelerated.

In particular, radiant heat from the filament unit 430 while a surface temperature of the filament unit 430 is equal to or greater than 1300° C. increases an efficiency of the change from the first source gas to the radical status.

Also, the heat and thermal electron emitted from the filament unit 430 collide with a gas in an adjacent region, i.e., the source gas and an inert gas for plasma generation, so that the heat and thermal electron generate a secondary electron. In this regard, the secondary electron also increases the efficiency of the change from the first source gas to the radical status.

The intermediate part 412 that is disposed between the filament unit 430 and the plasma generator 411 allows source gases to be uniformly supplied. A source in the radical status reaches a surface of the substrate S, so that a desired deposition layer is formed.

That is, a radical material formed of the first source material reacts to the chemical adsorbent layer formed of the second source material which is already adsorbed on the substrate S, or replaces a portion of the chemical adsorbent layer, so that AlxOy that is a final resultant deposition layer is formed on the substrate S. Here, the residue of the first source material forms the physical adsorbent layer and remains on the substrate S.

When the purge gas is injected from the purge part 460-2 or the purge part 460-3 toward the substrate S, the physical adsorbent layer that is formed of the first source material and that remains on the substrate S is detached from the substrate S, and is effectively removed from the substrate S via a pumping operation by the exhaustion units 470-4 and 470-5, so that purity of the deposition layer to be finally formed on the substrate S is increased.

Accordingly, the deposition layer including the first source material and the second source material is formed on the substrate S. In more detail, a single-layered atomic layer including $Al_xO_y$ is formed on the substrate S. Then, the substrate S is moved and sequentially corresponds to the second region 450-2 and the first region 410-2, so that required deposition layers may be further formed in a sequential manner.

According to the present embodiment, when the vapor deposition apparatus 400 changes the source gas to the radical status by using the plasma generator 411, the vapor deposition apparatus 400 uses the filament unit 430 so that the source gas is easily activated. By doing so, the efficiency of the change from the source gas to the radical status is increased, so that a characteristic of the deposition layer is easily improved.

Here, the deposition process may be performed while the substrate S and the vapor deposition apparatus 400 relatively move with respect to each other. That is, as illustrated in FIG. 7, the deposition process may be performed while the substrate S is moved in the X-axis direction of FIG. 7, or conversely, the vapor deposition apparatus 400 may move. However, in another embodiment of the example embodiments, the deposition process may be performed while the substrate S is fixed with respect to the vapor deposition apparatus 400.

Also, as in the previous embodiment of FIG. 4, positions of the substrate S and the vapor deposition apparatus 400 may be switched.

Figure 8:
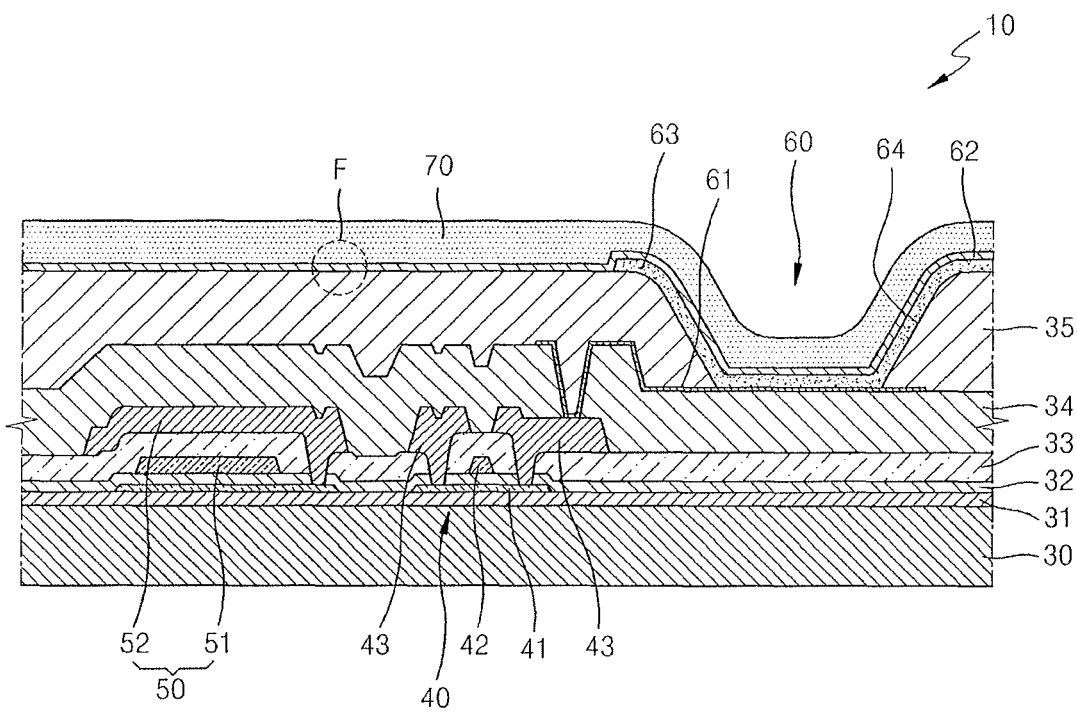
FIG. 8 is a cross-sectional view of an organic light-emitting display apparatus manufactured by using a vapor deposition apparatus according to an embodiment.
Figure 9:
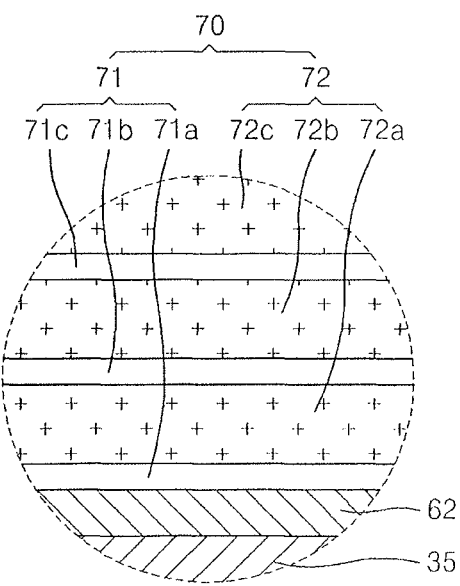
FIG. 9 is a magnified view of an F portion shown in FIG. 8.

FIG. 8 is a cross-sectional view illustrating an organic light-emitting display apparatus 10 that is manufactured by using a deposition apparatus according to an embodiment. FIG. 9 is a magnified view of an F portion shown in FIG. 8. In more detail, FIGS. 8 and 9 illustrate the organic light-emitting display apparatus 10 that is manufactured by using one of the vapor deposition apparatuses 100, 200, 300, and 400.

The organic light-emitting display apparatus 10 is formed on a substrate 30. The substrate 30 may be formed of a glass material, a plastic material, or a metal material.

A buffer layer 31 containing an insulating material is formed on the substrate 30 so as to planarize a top surface of the substrate 30 and to prevent moisture and foreign substances from penetrating into the substrate 30.

A thin-film transistor (TFT) 40, a capacitor 50, and an organic light-emitting device 60 are formed on the buffer layer 31. The TFT 40 includes, but not limited thereto, an active layer 41, a gate electrode 42, and source/drain electrodes 43. The organic light-emitting device 60 includes a first electrode 61, a second electrode 62, and an intermediate layer 63. The capacitor 50 includes a first capacitor electrode 51 and a second capacitor electrode 52.

In more detail, the active layer 41 formed as a predetermined pattern is disposed on a top surface of the buffer layer 31. The active layer 41 may include an inorganic semiconductor material such as silicon, an organic semiconductor material, or an oxide semiconductor material, and may be formed by injecting p-type or n-type dopant thereto. The first capacitor electrode 51 is formed from the same material layer as the active layer 41.

A gate insulating layer 32 is formed on the active layer 41. A gate electrode 42 is formed on the gate insulating layer 32 so as to correspond to the active layer 41. An interlayer insulating layer 33 is formed to cover the gate electrode 42, and the source/drain electrodes 43 are formed on the interlayer insulating layer 33 while the source/drain electrodes 43 contact a predetermined region of the active layer 41. The second capacitor electrode 52 may be formed from the same material layer as the source/drain electrodes 43.

A passivation layer 34 is formed to cover the source/drain electrodes 43, and a separate insulating layer may be further formed on the passivation layer 34 so as to planarize the TFT 40.

The first electrode 61 is formed on the passivation layer 34. The first electrode 61 is electrically connected to one of the source/drain electrodes 43. Then, a pixel-defining layer (PDL) 35 is formed to cover the first electrode 61. A predetermined opening 64 is formed in the PDL 35, and then an intermediate layer 63 including an organic emission layer in a region defined by the opening 64 is formed.

An encapsulation layer 70 is formed on the second electrode 62. The encapsulation layer 70 may include an organic material or an inorganic material, and may have a structure in which the organic material and the inorganic material are alternately stacked. The encapsulation layer 70 may be formed by using one of the vapor deposition apparatuses 100, 200, 300, and 400. That is, a desired layer may be formed while the substrate 30, whereon the second electrode 62 is formed, passes through one of the vapor deposition apparatuses 100, 200, 300, and 400.

In particular, the encapsulation layer 70 includes an inorganic layer 71 and an organic layer 72, e.g., the inorganic layer 71 includes a plurality of layers 71a, 71b, and 71c, and the organic layer 72 includes a plurality of 72a, 72b, and 72c. Here, it is possible to form the layers 71a, 71b, and 71c of the inorganic layer 71 by using one of the vapor deposition apparatuses 100, 200, 300, and 400.

However, the example embodiments are not limited thereto. That is, other insulating layers such as the buffer layer 31, the gate insulating layer 32, the interlayer insulating layer 33, the passivation layer 34, and the PDL 35 of the organic light-emitting display apparatus 10 may be formed by using one of the vapor deposition apparatuses 100, 200, 300, and 400. Also, various thin layers such as the active layer 41, the gate electrode 42, the source/drain electrodes 43, the first electrode 61, the second electrode 62, and the intermediate layer 63 may be formed by using one of the vapor deposition apparatuses 100, 200, 300, and 400.

Since the organic light-emitting display apparatus increases in size and requires high definition, it may not be easy to deposit a large thin film having a desired characteristic by conventional deposition apparatus. Also, there may be a limit in improving an efficiency of a conventional process of forming the thin film.

However, a characteristic of the deposition layer formed in the organic light-emitting display apparatus may be improved by using the vapor deposition apparatus according to the one or more embodiments, so that an electrical characteristic and an image quality of the organic light-emitting display apparatus may be improved. That is, according to the vapor deposition apparatus of the example embodiments, the deposition process may be efficiently performed and a characteristic of the deposition layer may be easily improved.

While the example embodiments has been particularly shown and described with reference to exemplary embodiments thereof, it will be understood by those of ordinary skill in the art that various changes in form and details may be made therein without departing from the spirit and scope of the example embodiments as defined by the following claims.

What is claimed is:
1. A vapor deposition apparatus for forming a deposition layer on a substrate, the vapor deposition apparatus comprising:

a supply unit configured to receive a first source gas;
a reaction space connected to the supply unit;
a plasma generator in the reaction space;
a first injection unit configured to inject a deposition source material to the substrate, the deposition source material including the first source gas;
a filament unit in the plasma generator, the filament unit being connected to a power source; and
an intermediate part having a hollow column shape and being between the plasma generator and the filament unit.

2. The vapor deposition apparatus of claim 1, further comprising a support pillar in the reaction space, the filament unit being wound around the support pillar.

3. The vapor deposition apparatus of claim 1, wherein the filament unit includes a metal material or a ceramic material.

4. The vapor deposition apparatus of claim 1, wherein the filament unit includes at least one of tungsten, tantalum, titanium, $LaB_6$, BaO, and SrO.

5. The vapor deposition apparatus of claim 1, wherein the plasma generator has a hollow column shape, the filament unit being inside the hollow column shape of the plasma generator.

6. The vapor deposition apparatus of claim 5, wherein the intermediate part is concentric with the plasma generator and the filament unit.

7. The vapor deposition apparatus of claim 6, wherein the intermediate part has a plurality of first holes facing the supply unit and a plurality of second holes facing the first injection unit.

8. The vapor deposition apparatus of claim 1, wherein a space is defined between the plasma generator and a corresponding surface of the reaction space, the corresponding surface of the reaction space being an inner circumferential surface of the reaction space overlapping the plasma generator, and plasma is configured to be generated in the defined space.

9. The vapor deposition apparatus of claim 1, wherein the plasma generator has an electrode form.

10. The vapor deposition apparatus of claim 1, further comprising a connection unit between the reaction space and the first injection unit, the connection unit having a width less than each of the reaction space and the first injection unit.

11. The vapor deposition apparatus of claim 1, wherein the substrate is closer to a ground than the vapor deposition apparatus, the first injection unit facing the ground.

12. The vapor deposition apparatus of claim 1, wherein thesubstrate is farther from a ground than the vapor deposition apparatus, the first injection unit being in an opposite direction with respect to the ground.

13. The vapor deposition apparatus of claim 1, wherein the substrate and the vapor deposition apparatus are configured to move relatively to each other.

14. The vapor deposition apparatus of claim 1, further comprising a second injection unit adjacent to the first injection unit, the second injection unit being separated from the first injection unit.

15. The vapor deposition apparatus of claim 14, wherein the second injection unit is configured to inject a purge gas or a second source material toward the substrate.

16. The vapor deposition apparatus of claim 1, further comprising a second injection unit and a third injection unit adjacent to the first injection unit, each of the second and third injection units being separated from the first injection unit, and the first injection unit being between the second and third injection units.

17. The vapor deposition apparatus of claim 16, wherein each of the second injection unit and the third injection unit is configured to inject toward the substrate one of a purge gas, a second source material, and a third source material.

18. The vapor deposition apparatus of claim 16, further comprising a plurality of exhaustion units adjacent to the first injection unit, the second injection unit, and the third injection unit, respectively.

19. The vapor deposition apparatus of claim 18, wherein the plurality of exhaustion units include a first exhaustion unit between the first injection unit and the second injection unit, and a second exhaustion unit between the first injection unit and the third injection unit.

20. A vapor deposition apparatus for forming a deposition layer on a substrate, the vapor deposition apparatus comprising:
a supply unit configured to receive a first source gas;
a reaction space connected to the supply unit;
a plasma generator in the reaction space;
a first injection unit configured to inject a deposition source material to the substrate, the deposition source material including the first source gas;
a filament unit in the reaction space, the filament unit being connected to a power source; and
an intermediate part between the plasma generator and the filament unit and having at least one hole facing the supply unit and at least one hole facing the first injection unit,
wherein the plasma generator has a hollow column shape, the filament unit being inside the hollow column shape of the plasma generator,
wherein the plasma generator has a plurality of first holes facing the supply unit and a plurality of second holes facing the first injection unit.

21. A vapor deposition apparatus for forming a deposition layer on a substrate, the vapor deposition apparatus comprising:
a plurality of first regions, each of the plurality of first regions including:
a supply unit configured to receive a first source gas,
a reaction space connected to the supply unit,
a plasma generator in the reaction space,
a first injection unit configured to inject a deposition source material to the substrate, the deposition source material including the first source gas,
a filament unit in the plasma generator, the filament unit being connected to a power source, and
an intermediate part having a hollow column shape and being between the plasma generator and the filament unit;
a plurality of second regions, each of the plurality of second regions being configured to inject a second source material toward the substrate; and
a plurality of purge parts, the plurality of purge parts being configured to inject a purge gas toward the substrate.

22. The vapor deposition apparatus of claim 21, wherein the plurality of purge parts are between the first regions and the second regions.

23. The vapor deposition apparatus of claim 21, further comprising a plurality of exhaustion units between the first regions, the second regions, and the purge parts, respectively.

* * * * *